Nov. 12, 1963 T. J. SOLTYS 3,110,849

TUNNEL DIODE DEVICE

Filed Oct. 3, 1960

Inventor:
Theodore J. Soltys,
by Joseph V. Claeys
His Attorney.

United States Patent Office 3,110,849

Patented Nov. 12, 1963

3,110,849
TUNNEL DIODE DEVICE

Theodore J. Soltys, Schenectady, N.Y., assignor to General Electric Company, a corporation of New York Filed Oct. 3, 1960, Ser. No. 60,201
1 Claim. (Cl. 317—237)

Figure 1:
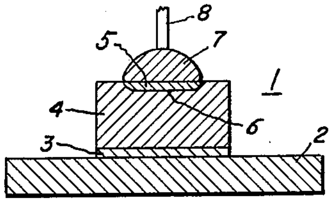

This invention relates to improved tunnel diode devices and particularly to such devices fabricated from gallium arsenide semiconductive material.

Tunnel diode devices are now well-known in the art and are two-terminal devices which comprise a space charge region less than 200 angstrom units wide such that the current-voltage characteristic thereof is determined primarily by the quantum mechanical tunneling process. The most widely known tunnel diode device comprises a P-N junction formed at the interface of a degenerate P-type semiconductive material and a degenerate N-type semiconductive material. Such a tunnel diode device exhibits a region of negative resistance in the low forward voltage range of its current-voltage characteristic. Further general information on such tunnel diode devices may be had by reference to the booklet "Tunnel Diodes" published in November 1959 by Research Information Services, General Electric Company, Schenectady, New York.

As used throughout the specifications and in the appended claim the term "degenerate" in a semiconductor device refers to a body or region which if P-type has substantially all of the states in an appreciable region near the top of the valence band emptied of electrons as shown on a Fermi-level diagram for the semiconductive material. Similarly, if the semiconductive material is N-type the term "degenerate" refers to a body or region of semiconductive material wherein substantially all of the states near the bottom of the conduction band are occupied by electrons as shown by such a Fermi-level diagram. Examples of Fermi-level diagrams for some typical semiconductive materials may be had by reference to the text entitled "Introduction to Semiconductors" by W. Crawford Dunlap, Jr., published in 1957 by John Wiley and Sons, Inc., New York.

The concentration of donor or acceptor impurities necessary to render a semiconductive material degenerate is usually greater than $10^{18}$ atoms per cubic centimeter and may be as great as the solubility of the respective impurity in the semiconductive material will allow.

Tunnel diode devices as distinguished from other semiconductor devices are not dependent upon minority carrier lifetime. The intermetallic compounds, which have always ben plagued by short minority carrier lifetimes, have therefore become important as tunnel diode materials. These intermetallic compounds, for example, have certain properties such as low effective masses and high mobilities which are a direct benefit to the operation of tunnel diode devices. One of the most attractive of these intermetallic compounds is gallium arsenide. Because of certain particular properties of gallium arsenide semiconductive material, for example, tunnel diode devices have been provided having extremely high current densities, with correspondingly low junction capacitance, and a very wide voltage swing, making possible wider fields of application for such devices. In addition, in my copending application, Serial No. 11,695, filed February 29, 1960, and assigned to the assignee of the present invention, there is described and claimed an improved gallium arsenide tunnel diode device having the very desirable characteristic of a high ratio of peak to minimum current which is greatly desired for many applications.

Although the above described commercial gallium arsenide tunnel diode devices have many advantages such devices have not been entirely satisfactory for all applications. For example, it has been found that operation of such commercial gallium arsenide tunnel diode devices at forward currents in excess of the peak current of the device tends to cause a deterioration in the electrical characteristics thereof, in particular, an eventual loss of the important negative resistance characteristic.

It is an object of this invention, therefore, to provide an improved gallium arsenide tunnel diode device capable of operation at forward currents greatly in excess of the peak current thereof without any significant change in electrical characteristics.

Briefly stated, in accordance with one aspect of this invention an improved tunnel diode device comprises a body of degenerate P-type gallium arsenide and a donor alloy material fused to one surface thereof establishing a recrystallized region therein of degenerate N-type conductivity. The donor alloy comprises 20% by weight of degenerate N-type gallium arsenide the remainder being tin.

Figure 2:
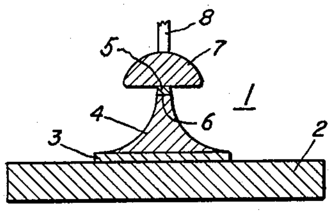

The features of my invention which I believe to be novel are set forth with particularity in the appended claim. My invention, however, both as to its organization and method of operation together with further objects and advantages thereof may best be understood by reference to the following description taken in connection with the accompanying drawing in which:

FIGS. 1 and 2 are vertical cross-sectional views of a tunnel diode device at different stages of fabrication in accordance with this invention.

In accordance with the present invention, an improved gallium arsenide tunnel diode device is fabricated utilizing a body of degenerate P-type conductivity gallium arsenide; the gallium arsenide body being rendered degenerate P-type by impregnating therein zinc or cadmium acceptor impurity to a concentration greater than $10^{18}$ atoms per cubic centimeter. An extremely narrow rectifying junction is formed in the body having a space charge region of less than about 200 angstrom units, by fusing thereto a donor alloy comprising a major proportion of tin and a minor proportion of degenerate N-type gallium arsenide. More specifically, the rectifying P-N junction is made by fusing a donor alloy to one surface of the degenerate P-type body to form a degenerate N-type recrystallized region therein. The donor alloy comprises 80% by weight of tin and 20% by weight of gallium arsenide rendered N-type and degenerate by impregnating therein sulfur donor impurity to a concentration greater than $10^{18}$ atoms per cubic centimeter. Preferably the resistivity of the N-type gallium arsenide constituent of the donor alloy is about $1.8 \times 10^{-4}$ ohm centimeters.

In FIG. 1 of the drawing there is illustrated a gallium arsenide tunnel diode device constructed in accord with the present invention. A body of gallium arsenide 1 is connected to a base plate 2 of suitable material such as, for example, platinum. Gallium arsenide body 1 is connected in good nonrectifying contact to base plate 2 by means of an acceptor alloy solder 3. Solder 3, for example, may be of indium with a small percentage of cadmium or zinc. Alternatively, the body 1 may be connected to base plate 2 by a suitable solder which contains neither donor or acceptor impurity in which case the conductivity-type of body 1 is not effected and the resulting connection is likewise nonrectifying. Gallium arsenide body 1 has a base region 4 and a recrystallized region 5 which exhibits N-type conductivity characteristics. In addition to its N-type conductivity characteristics, recrystallized region 5 has a concentration of donor impurity therein greater than $10^{18}$ atoms per cubic centimeter such that it is also degenerate. Regions 4 and 5 are separated by a narrow P-N junction 6 less than 200 angstrom units wide. The N-type conduction characteristics of region 5 are obtained by alloying and recrystallization techniques in the fusing to said body of a donor alloy dot 7. Connection is made to alloy dot 7 by a wire 8 which may be, for example, of platinum. Wire 8 may be soldered to alloy dot 7 or pressed thereinto during the alloying process.

Alloy dot 7, as described hereinbefore, is comprised of an alloy of 20% by weight of N-type gallium arsenide containing a donor impurity of sulfur sufficient to render the material degenerate and preferably of a resistivity of about $1.8 \times 10^{-4}$ ohm centimeters. The remaining 80% by weight of the alloy is tin.

For optimum utility it has been found that the junction capacitance of such tunnel diode devices should preferably be lower than that found in a device having a junction region such as shown in FIG. 1. The junction capacitance may be advantageously reduced by a reduction in the area of the junction. In the copending application of J. J. Tiemann, Serial No. 858,995, assigned to the assignee of the present invention, there is described and claimed a method of fabricating such tunnel diode devices utilizing a monitored and controlled electrolytic etching treatment to reduce the area of the junction and provide a tunnel diode device having the desired optimum electrical characteristics. The area of the junction 6, therefore, may be reduced by means of the method of the above Tiemann application, by a chemical etch or in other suitable manner. A typical tunnel diode device wherein the junction area is reduced by means of the method described and claimed in the Tiemann application is illustrated in FIG. 2.

In accord with the present invention small wafers, for example, approximately 0.025" square and approximately .004" thick are cut from an ingot of gallium arsenide and placed in a reaction chamber containing a quantity of elemental arsenic and a quantity of elemental cadmium or zinc. The arsenic is included in order to maintain stoichiometry in the gallium arsenide during the heating while the cadmium or zinc is utilized to render the gallium arsenide wafer degenerate and of P-type conductivity. The reaction chamber is then evacuated to a pressure of approximately one micron of mercury or less and heated to a temperature of approximately 900° C. to 1200° C. for a period sufficient to cause diffusion of zinc or cadmium into the wafer rendering it degenerate and of P-type conductivity. This may, for example, be accomplished in the time of 100 to 350 hours. Alternatively, a larger body of gallium arsenide may be treated and the small wafer cut therefrom. After treatment to render the body degenerate and of P-type conductivity it is lapped and etched as, for example, in white etch a mixture of three parts nitric acid to one part hydrofluoric acid to remove surface impurities.

The body is then connected to a base plate of a suitable material as for example, platinum by fusing with a suitable solder which may, for example, be predominately indium containing from one to twenty-five weight percent zinc or cadmium and preferably from two to six weight percent thereof. This may be accomplished by heating the body in a hydrogen atmosphere with the solder interposed between the gallium arsenide and the base plate to a temperature of from 300° C. to 500° C. for approximately 20 to 30 seconds.

A donor alloy is provided containing 80% by weight of tin, the remaining 20% by weight being N-type gallium arsenide. The gallium arsenide constituent of the donor alloy is rendered degenerate and of N-type conductivity by impregnating therein a donor impurity of sulfur to a concentration greater than $10^{18}$ atoms per cubic centimeter providing a resistivity preferably of about $1.8 \times 10^{-4}$ ohm centimeters. The sulfur donor impurity may be impregnated in the manner set out hereinbefore or in other manner known to the art. The donor alloy is formed from this degenerate N-type gallium arsenide and tin in the proportions set out above. After the foregoing operation a small quantity of the donor activator alloy is placed upon the upper exposed surface of the wafer. The wafer and alloy are heated in a hydrogen atmosphere for a time and at a temperature sufficient to cause the alloying therebetween necessary for the formation of a degenerate N-type recrystallized region and a narrow P-N junction. This may be accomplished by heating at a temperature of 600° C. to 700° C. for forty to ninety seconds but preferably at a temperature of 650° C. for approximately sixty-five seconds. The operations described above establishes a narrow junction space charge region less than 200 angstrom units wide with a degenerate region of gallium arsenide having opposite conductivity characteristics on either side thereof.

While only certain preferred features of the invention have been shown by way of illustration, many modifications and changes will occur to those skilled in the art. It is, therefore, to be understood that the appended claim is intended to cover all such modifications and changes as fall within the true spirit and scope of the invention.

What I claim as new and desire to secure by Letters Patent of the United States is:

A tunnel diode device comprising: a crystalline body of P-type gallium arsenide having an acceptor impurity therein selected from the group consisting of zinc and cadmium, the concentration of said acceptor impurity exceeding $10^{18}$ atoms per cubic centimeter; a rectifying electrode including an ohmic contact of material constituted of 80 percent by weight tin and 20 percent by weight degenerate N-type gallium arsenide, said N-type gallium arsenide having sulfur donor impurity therein exceeding the concentration of $10^{18}$ atoms per cubic centimeter, and an N-type degenerate, recrystallized region in said body contiguous with said ohmic contact, said recrystallized region being formed by heating in an inert atmosphere said body in contact with said ohmic contact to a temperature in the range between 600° C. and 700° C. for from 40 to 90 seconds; and, a nonrectifying contact connected to said body.

References Cited in the file of this patent

UNITED STATES PATENTS

| | | |
|---|---|---|
| 2,847,335 | Gremmelmaier et al. | Aug. 12, 1958 |
| 2,956,216 | Jenny | Oct. 11, 1960 |
| 2,956,217 | Meyerhofer | Oct. 11, 1960 |
| 3,012,175 | Jones et al. | Dec. 5, 1961 |
| 3,033,714 | Ezaki et al. | May 8, 1962 |
| 3,041,508 | Henkel et al. | June 26, 1962 |
| 3,070,467 | Fuller et al. | Dec. 25, 1962 |

OTHER REFERENCES

Schillmann: "Uber Einbau und Wirkung von Fremdstoffen in Indiumarsenide," Z. Naturforschg., V. 11a, 1956, pp. 463–472.